(12) United States Patent
Foltyn et al.

(10) Patent No.: US 7,258,927 B2
(45) Date of Patent: Aug. 21, 2007

(54) HIGH RATE BUFFER LAYER FOR IBAD MGO COATED CONDUCTORS

(75) Inventors: Stephen R. Foltyn, Los Alamos, NM (US); Quanxi Jia, Los Alamos, NM (US); Paul N. Arendt, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 0 days.

(21) Appl. No.: 11/021,800

(22) Filed: Dec. 23, 2004

(65) Prior Publication Data

US 2006/0141291 A1 Jun. 29, 2006

(51) Int. Cl.
*B32B 15/00* (2006.01)
(52) U.S. Cl. .................. 428/469; 428/698; 428/701; 428/702; 505/237; 505/239
(58) Field of Classification Search .............. None
See application file for complete search history.

(56) References Cited

U.S. PATENT DOCUMENTS

| | | | |
|---|---|---|---|
| 5,878,175 A * | 3/1999 | Sonoda et al. ................. | 385/2 |
| 6,756,139 B2 * | 6/2004 | Jia et al. ..................... | 428/701 |
| 2003/0143438 A1 * | 7/2003 | Norton et al. .............. | 428/702 |

* cited by examiner

*Primary Examiner*—Jennifer McNeil
*Assistant Examiner*—Timothy M. Speer
(74) *Attorney, Agent, or Firm*—Bruce H. Cottrell

(57) ABSTRACT

Articles are provided including a base substrate having a layer of an oriented material thereon, and, a layer of hafnium oxide upon the layer of an oriented material. The layer of hafnium oxide can further include a secondary oxide such as cerium oxide, yttrium oxide, lanthanum oxide, scandium oxide, calcium oxide and magnesium oxide. Such articles can further include thin films of high temperature superconductive oxides such as YBCO upon the layer of hafnium oxide or layer of hafnium oxide and secondary oxide.

19 Claims, No Drawings

HIGH RATE BUFFER LAYER FOR IBAD MGO COATED CONDUCTORS

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to high temperature superconducting thick films on substrates, e.g., polycrystalline substrates, such superconducting thick films having high $J_c$'s and $I_c$'s, and relates to structural template articles for subsequent deposition of an oriented film, e.g., of superconducting thick films.

BACKGROUND OF THE INVENTION

U.S. Pat. No. 6,756,139 described a coated conductor architecture based on ion beam assisted deposited magnesium oxide (IBAD-MgO), which comprises four or five separately deposited layers between the metal substrate and the superconducting layer. Among the described structures are included: (1) a structure including a substrate/a layer of aluminum oxide ($Al_2O_3$)/a layer of yttrium oxide ($Y_2O_3$)/a layer of IBAD-MgO/a homoepitaxial layer of MgO/a layer of strontium ruthenate ($SrRuO_3$)/a layer of yttrium barium copper oxide (YBCO); and (2) a structure including a substrate/a layer of erbium oxide ($Er_2O_3$)/a layer of IBAD-MgO/a homoepitaxial layer of MgO/a layer of $SrRuO_3$/a layer of YBCO. Other architectures have employed strontium titanate in place of strontium ruthenate or mixtures of strontium titanate and strontium ruthenate.

Excellent critical current density values have been achieved using either of these architectures, but layers of strontium ruthenate and/or strontium titanate may present unwanted difficulties in practical commercial processes. Specifically, while benchscale research on such materials generally employed pulsed laser deposition (PLD) that produced high quality stoichiometric films, PLD has not been preferred for commercial production of coated conductors due to high capital costs of laser equipment and relative small deposition areas. Other deposition processes such as sputtering are generally desired for commercial production, but multicomponent films of strontium titanate or strontium ruthenate are not optimally deposited by sputtering.

Due to these problems, a substitute material for multi-component films such as strontium titanate or strontium ruthenate is desired. Among the requirements for such a replacement material are the option of using sputter deposition of a metal target as opposed to a metal oxide target and the preference for a single component metal target rather than an alloy of metals such as strontium and titanium.

After careful experimentation by the present inventors, a substitute material of hafnium oxide has now been found for strontium ruthenate or strontium titanate.

SUMMARY OF THE INVENTION

In accordance with the purposes of the present invention, as embodied and broadly described herein, the present invention provides an article including a base substrate having a layer of an oriented material thereon, and, a layer of hafnium oxide upon the layer of an oriented material. In one embodiment, the article of the present invention includes a layer of an oriented material thereon, such layer deposited by ion beam assisted deposition (IBAD) and further includes a homoepitaxial or heteroepitaxial layer of an oriented material upon the IBAD layer. In one embodiment, the article of the present invention further includes a layer of a high temperature superconducting material such as YBCO. The base substrate can be a polycrystalline metal and can be a composite base substrate including other layers such as an inert oxide material layer and an oxide or oxynitride material layer on the inert oxide layer. In another embodiment of the invention, while a single metal oxide such as hafnium oxide may be preferred, such a hafnium oxide layer can further include a secondary oxide such as cerium oxide, yttrium oxide, lanthanum oxide, scandium oxide, calcium oxide or magnesium oxide.

The present invention further provides a process of forming an article including a base substrate including a layer of an oriented material thereon, and, a layer of hafnium oxide upon the layer of an oriented material, the process including depositing a layer of an oriented material upon the base substrate, such deposition preferably using ion beam assisted deposition, and, depositing a layer of hafnium oxide upon the layer of an oriented material. Preferably, the process includes depositing a homoepitaxial or heteroepitaxial layer of an oriented material on the IBAD oriented material.

DETAILED DESCRIPTION

The present invention is concerned with coated conductors, especially coated conductors including an IBAD-MgO layer and YBCO, although the article of the present invention may be used in other applications than superconductivity and with substrates other than with IBAD-MgO. In particular, the present invention is concerned with the replacement of any strontium titanate or strontium ruthenate layer, often deposited as a buffer layer on such an MgO layer, with a layer of hafnium oxide. In another embodiment of the invention, the hafnium oxide layer can further include a secondary oxide material such as cerium oxide, yttrium oxide, lanthanum oxide, scandium oxide, calcium oxide, magnesium oxide and the like.

The term "coated conductor" refers to flexible composite structures including a high temperature superconducting layer.

Hafnium oxide is a suitable buffer material where the article of the present invention includes a high temperature superconducting layer as hafnium oxide is substantially non-reactive with each of the other intended materials in the present article. Additionally, the crystalline structure of hafnium oxide can support epitaxial growth upon oriented materials such as magnesium oxide, yttria-stabilized zirconia (YSZ), titanium nitride, or may support epitaxial growth upon oriented materials such as rolling-assisted biaxially textured substrates (RABiTs) or an epitaxial oxide buffer layer thereon. In one preferred embodiment, the oriented material is a rock-salt-like structure of magnesium oxide and the article further includes a high temperature superconducting material such as YBCO. While not wishing to be bound by the present explanation, the crystalline structure of the deposited hafnium oxide layer is believed to be cubic phase. In another embodiment of the present invention, the hafnium oxide layer can further include a secondary oxide such as cerium oxide, yttrium oxide, lanthanum oxide, scandium oxide, calcium oxide, magnesium oxide and the like.

Generally, where the layer includes both hafnium oxide and a secondary oxide such as cerium oxide or the like, the layer can include hafnium oxide in amounts of from about 10 atomic percent of hafnium oxide to about 100 atomic percent of hafnium oxide, more preferably 25 atomic percent of hafnium oxide to about 100 atomic percent of hafnium oxide, the remainder being the secondary oxide such as cerium oxide.

The buffer layer of hafnium oxide can generally be from about 10 nanometers to about 100 nanometers in thickness. The buffer layer of hafnium oxide can be deposited, e.g., by pulsed laser deposition or by methods such as evaporation including e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like. Sputtering techniques may be preferred.

In the present invention, any high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium, may also be used. A mixture of the rare earth metal europium with yttrium may be one preferred combination as the superconducting material. Other superconducting materials such as bismuth and thallium based superconductor materials may also be employed. $YBa_2Cu_3O_{7-\delta}$ is generally preferred as the superconducting material. YBCO typically has a superconducting transition temperature of greater than about 87 K and such a temperature is presently generally considered as a high temperature for superconductive materials as it allows the use of liquid nitrogen as the coolant. Slightly lower temperatures may generally be considered as well as a high temperature for superconductive materials.

Addition of selected particulate materials to the high temperature superconducting material can enhance flux pinning properties. Such particulate materials can be of barium zirconate, yttrium barium zirconate, yttrium oxide and the like. The particulates are preferably sizes from about 5 nanometers to about 100 nanometers in major dimension and are generally present in amounts of from about 1 to about 20 weight percent.

In one embodiment of the present invention, an article is provided including a base substrate, an intermediate layer of an oriented material, and a layer of hafnium oxide upon the layer of an oriented material. One or more structural layers can be placed between the base substrate and the layer of an oriented material. Such structural layers can include a layer of an inert material such as aluminum oxide ($Al_2O_3$) and the like upon the base substrate and a layer of an oxide or oxynitride material such as $Y_2O_3$, AlON and the like on the layer of an inert material, thus forming a composite base substrate. Upon such a composite base substrate can be deposited the layer of an oriented material. Preferably, the layer of an oriented material is deposited by ion beam assisted deposition as is now commonly referred to as IBAD. The article can further include a homoepitaxial or heteroepitaxial layer of an oriented material upon the IBAD layer of oriented material. In still other embodiments, the article can additionally include a layer of a high temperature superconducting material directly on the layer of hafnium oxide. Optionally, other buffer layers, such as cerium oxide, yttrium oxide and the like, may be present between the hafnium oxide and the YBCO, although additional layers may not be generally preferred.

High temperature superconducting (HTS) layers, e.g., a YBCO layer, can be deposited, e.g., by pulsed laser deposition or by methods such as evaporation including e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, atomic layer deposition (a CVD process), molecular beam epitaxy, a sol-gel process, liquid phase epitaxy and the like.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating. The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (Å/s) to about 200 Å/s by changing the laser repetition rate from about 0.1 hertz (Hz) to about 200 Hz. Generally, the laser beam can have dimensions of about 1 millimeter (mm) by 4 mm with an average energy density of from about 1 to 4 joules per square centimeter ($J/cm^2$). After deposition, the films generally are cooled within an oxygen atmosphere of greater than about 100 Torr to room temperature.

The thin films of high temperature superconducting materials are generally from about 0.2 microns to about 10 microns in thickness, more preferably in the range of from about 1.5 µm to about 5 µm.

In the present invention, the high temperature superconducting material can be upon any suitable base substrate. For coated conductors of a high temperature superconducting material such as YBCO, the base substrate can be, e.g., a polycrystalline material such as polycrystalline metals or polycrystalline ceramics or can be a single crystal base substrate such as lanthanum aluminum oxide, aluminum oxide, magnesium oxide and the like. Also, the initial or base substrate can be an amorphous substrate such as silica, metallic glass, or glass. Also, the substrate may be selected from rolling-assisted biaxially textured substrates (RABiTS) including a metal such as nickel or copper, such substrates described, e.g., by Goyal et al., in U.S. Pat. No. 6,150,034. In one embodiment, the base substrate can be a polycrystalline metal such as a metal alloy. Nickel-based alloys such as various Hastelloy metals, Haynes metals and Inconel metals are useful as the base substrate. Iron-based substrates such as steels and stainless steels may be used as the base substrate. Copper-based substrates such as copper-beryllium alloys may also be useful as the base substrate. In one embodiment, the base substrate can be a polycrystalline ceramic such as polycrystalline aluminum oxide, polycrystalline yttria-stabilized zirconia (YSZ), forsterite, yttrium-iron-garnet (YIG), silica and the like.

A layer of an oriented material can be used within the article of the present invention as a critical layer between the base substrate (such as a polycrystalline metal) and an ultimate top-layer such as, e.g., a high temperature superconducting layer. The layer of oriented material can be a cubic oxide material and can have, e.g., a rock-salt-like structure. Such oriented cubic oxide materials can be, e.g., magnesium oxide, calcium oxide, strontium oxide, zirconium oxide, barium oxide, europium oxide, samarium oxide and other materials such as described in WO 99/25908 by Do et al. Other oriented materials may be used as well, e.g., cerium oxide having a fluoride structure, strontium ruthenate or lanthanum manganate having a perovskite structure, lanthanum aluminate having an orthorhombic structure, or a nitride material such as titanium nitride and the like. In the case of rolling-assisted biaxially textured substrates (RABiTs), one or more epitaxial oxide buffer layers can be deposited upon the biaxially-oriented surface of the substrate. Such epitaxial oxide buffer layers can be yttrium oxide, cerium oxide, yttria-stabilized zirconia or others as well known to those skilled in the art.

The ultimate application can determine the selection of the material for the base substrate. For example, the selection of the base substrate on which a subsequent superconducting material (e.g., YBCO) is deposited can allow for the resultant article to be flexible whereby superconducting articles (e.g., coils, motors or magnets) can be shaped. Thus, for superconducting applications requiring flexible substrates, the base substrate is generally a polycrystalline metal as these materials are usually flexible, i.e., they can be shaped. For other applications, the base substrate on which other oriented materials are deposited may be polycrystalline ceramics, either flexible or non-flexible. For still other applications, the base substrate may be a single crystal substrate such as magnesium oxide, lanthanum aluminate, or aluminum oxide.

The present invention is more particularly described in the following examples that are intended as illustrative only, since numerous modifications and variations will be apparent to those skilled in the art.

EXAMPLE 1

A coated conductor in accordance with the present invention was formed with the following structure: a Hastelloy base substrate/a layer of $Al_2O_3$/a layer of $Y_2O_3$/a layer of IBAD-MgO/a homoepitaxial layer of MgO/a layer of $HfO_2$/a layer of YBCO. The layer of $HfO_2$ was deposited by pulsed laser deposition using a substrate temperature of 820° C., a background oxygen pressure of 0.3 Torr until a hafnium oxide thickness of from about 50 to about 100 nanometers was formed. A YBCO layer was deposited onto the hafnium oxide layer and from this structure, the measured properties of the YBCO layer (1.3 μm in thickness) were: a superconducting transition temperature ($T_c$) of 88.7 K, and a critical current density ($J_c$) of 1.0 megampereres per square centimeter ($MA/cm^2$) at 75 K. Analysis by x-ray diffraction showed the YBCO film as c-axis oriented. Rocking curve measurements on an oriented (005) YBCO film showed a full width at half maximum value of about 1.8 degrees. While the results for $T_c$ and $J_c$ were not as high as current state of the art measurements, they demonstrate that the $HfO_2$ can provide nearly the performance of the earlier multi-component buffer layers of strontium ruthenate or strontium titanate.

EXAMPLE 2

A coated conductor in accordance with the present invention was formed with the following structure: a Hastelloy base substrate/a layer of $Al_2O_3$/a layer of $Y_2O_3$/a layer of IBAD-MgO/a homoepitaxial layer of MgO/a layer of $HfO_2$/a layer of $CeO_2$/a layer of YBCO. The layer of $HfO_2$ was deposited by pulsed laser deposition using a substrate temperature of 820° C., a background oxygen pressure of 0.3 Torr until a hafnium oxide thickness of from about 50 to about 100 nanometers was formed. The layer of cerium oxide was deposited onto the $HfO_2$ oxide layer by pulsed laser deposition using a substrate temperature of 760° C., a background oxygen pressure of 0.2 Torr until a cerium oxide thickness of about 20 nanometers was formed. The YBCO layer was deposited onto the cerium oxide layer and from this structure, the measured properties of the YBCO layer (1.3 μm in thickness) were: a superconducting transition temperature ($T_c$) of >87 K, and an in-plane texture of 2.4 degrees full width half maximum (FWHM). The results demonstrate that a cerium oxide buffer can be used between the $HfO_2$ layer and the YBCO and provide good performance.

EXAMPLE 3

Coated conductors in accordance with the present invention were formed with the following structure: a Hastelloy base substrate/a layer of $Al_2O_3$/a layer of $Y_2O_3$/a layer of IBAD-MgO/a homoepitaxial layer of MgO/a layer including both hafnium oxide ($HfO_2$) and cerium oxide ($CeO_2$)/a layer of YBCO. The layer of $HfO_2/CeO_2$ was deposited by pulsed laser deposition using a target having the desired elemental ratio, such targets available from Praxair Co. The targets used were: (a) $Hf_{0.75}Ce_{0.25}O_2$ (i.e., 25 atomic percent cerium and 75 atomic percent hafnium based on the metals); (b) $Hf_{0.50}Ce_{0.50}O_2$ (50 atomic percent cerium and 50 atomic percent hafnium; and, (c) $Hf_{0.25}Ce_{0.75}O_2$ (75 weight percent cerium and 25 weight percent hafnium). Typical conditions were used for such depositions. The resulting coated conductors were examined by x-ray diffraction and each sample showed purely c-axis orientation. The measured $T_c$'s of the coated conductors were about 86 K.

Although the present invention has been described with reference to specific details, it is not intended that such details should be regarded as limitations upon the scope of the invention, except as and to the extent that they are included in the accompanying claims.

What is claimed is:

1. An article comprising:
  a base substrate having a layer of an oriented material thereon, the oriented material selected from the group consisting of oriented oxide materials and oriented nitride material; and,
  a layer of epitaxial hafnium oxide upon the layer of an oriented material, the layer of hafnium oxide further including a secondary oxide selected from the group consisting of cerium oxide, yttrium oxide, lanthanum oxide, scandium oxide, calcium oxide, and magnesium oxide.

2. The article of claim 1 wherein the layer of hafnium oxide includes cerium oxide.

3. The article of claim 1 wherein the layer of hafnium oxide includes from about 0.1 atomic percent of the secondary oxide to about 90 atomic percent secondary oxide.

4. The article of claim 1 wherein the layer of an oriented material is magnesium oxide.

5. The article of claim 1 wherein the layer of an oriented material includes a first layer deposited by ion beam assisted deposition and a second layer of a homoepitaxial or heteroepitaxial material on the first layer.

6. The article of claim 5 wherein the first layer of an oriented material is magnesium oxide.

7. The article of claim 5 wherein said layer of oriented material includes a first layer of magnesium oxide and a second layer of a homoepitaxial layer of magnesium oxide.

8. The article of claim 5 wherein said layer of oriented material includes a first layer of magnesium oxide and a second layer of a heteroepitaxial layer of titanium nitride.

9. The article of claim 1 wherein the base substrate is a flexible polycrystalline metal.

10. The article of claim 1 wherein the layer of hafnium oxide has a thickness of from about 10 nanometers to about 100 nanometers.

11. The article of claim 1 wherein the base substrate further includes an inert oxide material layer between the base substrate and the layer of an oriented material.

12. The article of claim 11 wherein the inert oxide material layer is selected from the group consisting of aluminum oxide, erbium oxide, and yttrium oxide.

13. The article of claim 1 wherein the base substrate further includes an inert oxide material layer selected from the group consisting of aluminum oxide, erbium oxide, and yttrium oxide on the base substrate, and a layer of an oxide or oxynitride material upon the inert oxide material layer and the layer of an oriented material is upon the layer of an oxide or oxynitride material.

14. The article of claim 13 wherein the oxide or oxynitride material layer is selected from the group consisting of yttrium oxide, aluminum oxynitride, erbium oxide, yttria-stabilized zirconia, cerium oxide and europium oxide.

15. The article of claim 1 further including a layer of a high temperature superconductive oxide material upon the layer of hafnium oxide.

16. The article of claim 15 wherein the high temperature superconductive oxide material is a yttrium barium copper oxide (YBCO).

17. The article of claim 16 wherein the layer of a yttrium barium copper oxide includes selected additional flux pinning particulates therein.

18. The article of claim 17 wherein the flux pinning particulates are of barium zirconate.

19. The article of claim 16 further including a layer of cerium oxide between the layer of hafnium oxide and the YBCO layer.

* * * * *